United States Patent
Koch et al.

(10) Patent No.: US 10,411,430 B1
(45) Date of Patent: Sep. 10, 2019

(54) OPTICAL SYSTEM AND METHOD FOR LOCKING A WAVELENGTH OF A TUNABLE LASER

(71) Applicant: Aurrion, Inc., Goleta, CA (US)

(72) Inventors: Brian R. Koch, San Carlos, CA (US); Jonathan Edgar Roth, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 160 days.

(21) Appl. No.: 15/132,596

(22) Filed: Apr. 19, 2016

Related U.S. Application Data

(60) Provisional application No. 62/149,698, filed on Apr. 20, 2015.

(51) Int. Cl.

| | |
|---|---|
| *H01S 3/13* | (2006.01) |
| *H01S 5/00* | (2006.01) |
| *H01S 3/08* | (2006.01) |
| *H01S 3/00* | (2006.01) |
| *H01S 3/137* | (2006.01) |
| *H01S 3/10* | (2006.01) |

(52) U.S. Cl.
CPC .......... *H01S 3/1305* (2013.01); *H01S 3/0014* (2013.01); *H01S 3/08027* (2013.01); *H01S 3/10061* (2013.01); *H01S 3/137* (2013.01)

(58) Field of Classification Search
CPC .. H01S 3/1305; H01S 3/08027; H01S 3/0014; H01S 3/10061; H01S 3/137
See application file for complete search history.

(56) References Cited

U.S. PATENT DOCUMENTS

| | | | | |
|---|---|---|---|---|
| 5,706,301 | A * | 1/1998 | Lagerstrom | H01S 3/1392 372/29.021 |
| 8,922,877 | B1 * | 12/2014 | Goodno | H01S 3/0085 359/337 |
| 2006/0065834 | A1 * | 3/2006 | Flanders | G01J 1/32 250/339.07 |
| 2006/0083277 | A1 * | 4/2006 | Zhu | H01S 3/1392 372/39 |
| 2006/0215713 | A1 * | 9/2006 | Flanders | H01S 3/08059 372/20 |
| 2013/0083815 | A1 * | 4/2013 | Fang | H01S 5/026 372/20 |
| 2016/0282640 | A1 * | 9/2016 | Guzzon | G02F 1/0121 |
| 2018/0074350 | A1 * | 3/2018 | Guzzon | G02F 1/0121 |

* cited by examiner

*Primary Examiner* — Yuanda Zhang
(74) *Attorney, Agent, or Firm* — Schwegman Lundberg & Woessner, P.A.

(57) ABSTRACT

An optical system can lock a wavelength of a tunable laser to a specified wavelength of a temperature-insensitive spectral profile of a spectral filter. In some examples, the spectral filter, such as a Fabry-Perot filter, can have a temperature-insensitive peak wavelength and increasing attenuation at wavelengths away from the peak wavelength. The spectral filter can spectrally filter the laser light to form filtered laser light. A detector can detect at least a fraction of the filtered laser light. Circuitry coupled to the detector and the laser can tune the tunable laser to set a signal from the detector to a specified value corresponding to a specified wavelength in the spectral profile, and thereby adjust the selectable wavelength of the tunable laser to match the specified wavelength. In some examples, the optical system can include a polarization rotator, and can use polarization to separate incident light from return light.

23 Claims, 7 Drawing Sheets

OPTICAL SYSTEM AND METHOD FOR LOCKING A WAVELENGTH OF A TUNABLE LASER

CROSS-REFERENCE TO RELATED APPLICATION

This application claims the benefit of priority to U.S. Provisional Application No. 62/149,698, filed on Apr. 20, 2015, the entire contents of which is incorporated herein by reference.

TECHNICAL FIELD

The subject matter disclosed herein generally relates to locking a wavelength of a tunable laser to a peak wavelength of a temperature-insensitive spectral filter.

BACKGROUND

In some technical fields, such as telecommunications, it can be desirable to reduce a sensitivity to temperature of an output wavelength of a tunable laser, so that the output wavelength is largely or fully insensitive to a temperature of the laser.

BRIEF DESCRIPTION OF THE DRAWINGS

The figures of the accompanying drawings provide non-limiting and non-exhaustive examples of some embodiments. Like reference numerals refer to like parts throughout the various view unless otherwise specified. The following figures are not drawn to scale.

DETAILED DESCRIPTION

An optical system can lock a wavelength of a tunable laser to a specified wavelength of a temperature-insensitive spectral profile of a spectral filter. In some examples, the spectral filter, such as a Fabry-Perot filter, can have a temperature-insensitive peak wavelength and increasing attenuation at wavelengths away from the peak wavelength. The spectral filter can spectrally filter the laser light to form filtered laser light. A detector can detect at least a fraction of the filtered laser light. Circuitry coupled to the detector and the laser can tune the tunable laser to set a signal from the detector to a specified value corresponding to a specified wavelength in the spectral profile, and thereby adjust the selectable wavelength of the tunable laser to match the specified wavelength. In some examples, the optical system can include a polarization rotator, and can use polarization to separate incident light from return light.

Figure 1:
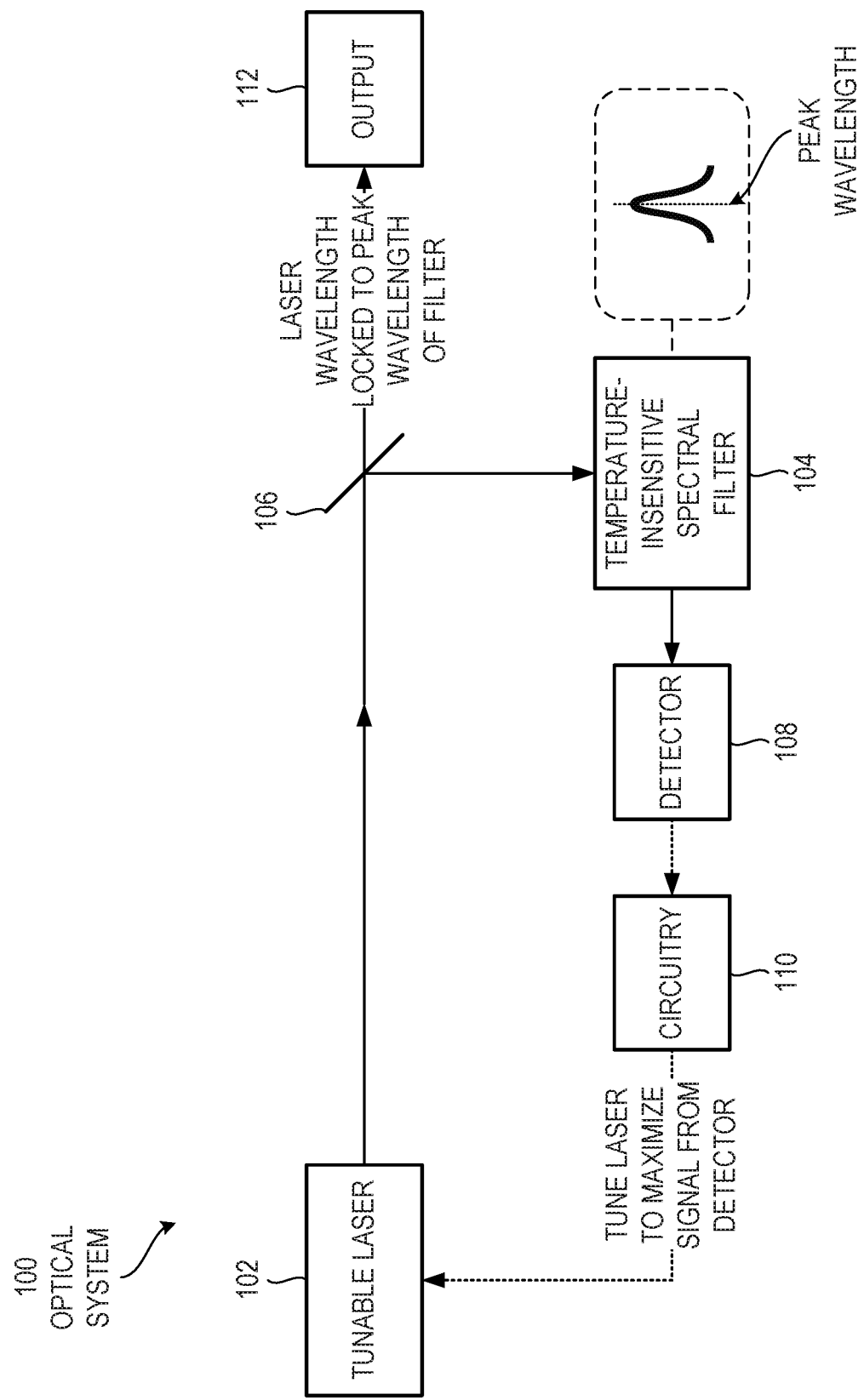
FIG. 1 is a block diagram showing an example of an optical system that can lock a wavelength of a tunable laser, in accordance with some embodiments.

FIG. 1 is a block diagram showing an example of an optical system 100 that can lock a wavelength of a tunable laser 102, in accordance with some embodiments. The configuration of FIG. 1 is but one example of an optical system 100 an optical system that can automatically lock a wavelength of a tunable laser; other suitable configurations can also be used.

The tunable laser 102 can produce laser light at a selectable wavelength. In some examples, the tunable laser 102 can be a diode laser having a wavelength that can be adjusted electrically. In some examples, the tunable laser 102 can be formed a part of layered structure in a photonic integrated circuit. In some examples, one or more waveguides in a photonic integrated circuit can receive light from the tunable laser 102, and direct the light to downstream elements in the optical system 100.

A power tap 106 can direct a first fraction of the laser light to form a laser light output 112, and direct a second fraction of the laser light, separate from the first fraction of the laser light, to a spectral filter 104. In the configuration of FIG. 1, the power tap 106 is external to the tunable laser 102. In other configurations, the power tap 106 can be internal to the tunable laser 102, so that the tunable laser 102 produces multiple outputs, all coupled to laser oscillations from the same laser cavity, and all simultaneously tuned to the same wavelength. For configurations in which the power tap 106 is internal to the tunable laser 102, the optical system 100 can direct one laser output to the temperature-insensitive spectral filter and another laser output to additional optical elements or a downstream system. For these multiple-output configurations, the laser output directed to the temperature-insensitive spectral filter 104 is considered to be a fraction of the total laser output.

A spectral filter 104 can have a temperature-insensitive peak wavelength and increasing attenuation at wavelengths away from the peak wavelength. The spectral filter 104 can spectrally filter the laser light to form filtered laser light.

In some example, the spectral filter 104 can be a temperature-insensitive Fabry-Perot filter. In these examples, the Fabry-Perot filter can be formed from first and second reflectors defining a cavity between the first and second reflectors. The cavity can be filled with a material having a refractive index. The cavity can have an optical path length defined as a physical distance multiplied by the refractive index (optionally integrated over the length of the cavity, for cavities in which the refractive index varies along a length of the cavity). To achieve insensitivity to temperature, the cavity can be constructed so that the optical path length is insensitive to temperature. Specifically, the cavity can be designed to balance a change in physical path length with a corresponding change in refractive index, so that the optical path length remains constant over a specified range of temperatures. The Fabry-Perot filter can have one or more peak wavelengths, for wavelengths at which the optical path length is an integral multiple of the wavelengths. If the optical path length of the cavity is insensitive to wavelength, then the one or more peak wavelengths are also insensitive to wavelength. The Fabry Perot filter can be constructed to have a free spectral range large enough to select a single peak wavelength, of the one or more peak wavelengths. In some examples, the Fabry-Perot filter can be formed as part of an integral structure with a photonic integrated circuit (such as in FIGS. 2-4). In other examples, the spectral filter can be formed away from a photonic integrated circuit, and connected to the photonic integrated circuit by a single-mode fiber (such as in FIGS. 5 and 6).

In some examples, such as the configuration of FIG. 1, the spectral filter can have a peak wavelength, corresponding to a wavelength at which the spectral filter has a maximum power transmission (if the spectral filter is used in transmission) or reflection (if the spectral filter is used in reflection). For these cases, the spectral filter can have increasing attenuation at wavelengths away from the peak wavelength. In other examples, the spectral filter can have a null wavelength, rather than a peak wavelength, where the null wavelength corresponds to a wavelength at which the spectral filter has a minimum power transmission (if the spectral filter is used in transmission) or reflection (if the spectral filter is used in reflection). For these cases, the spectral filter can have decreasing attenuation at wavelengths away from the null wavelength. In some examples, the spectral filter may have a well-defined spectral profile as a function of wavelength. In some examples, the optical system can lock the laser wavelength to a specific portion of spectral profile (e.g., not necessarily the peak or null wavelength), such as a 50% value, an inflection point, a specified value of the spectral profile, a specified value of a first derivative of the spectral profile, a specified value of a second derivative of the spectral profile, or another suitable value.

A detector 108 can detect at least a fraction of the filtered laser light. In some examples, a power tap can direct at least a fraction of the filtered laser light to the detector 108 (such as in FIG. 2). In other examples, a polarization-sensitive element, such as a polarization-splitting grating coupler, can separate incident light from exiting light, and can direct exiting light toward the detector 108 (such as in FIGS. 3, 5, and 6).

Circuitry 110 can be coupled to the detector 108 and the tunable laser 102. The circuitry 110 can tune the tunable laser to enhance (optimally maximize) a signal from the detector 108 and thereby adjust the selectable wavelength of the tunable laser 102 to match the peak wavelength of the spectral filter 104. The circuitry 110 can be processor-based, can be formed from discrete components, or can be a combination of processor-based and discrete. In some examples, the circuitry 110 can apply a dither to the tunable wavelength, so that the wavelength of the tunable laser 102 varies with a periodic oscillation. In these examples, the circuitry 110 can sense a polarity of the periodic oscillation, can use the polarity to determine which side of the peak wavelength the tunable laser 102 output is on, and can form a servo that locks the peak wavelength of the tunable laser 102 to the peak wavelength of the spectral filter 104. In other examples, the circuitry 110 can dither the peak wavelength of the spectral filter 104. In still other examples, the circuitry 110 can apply a hill-climbing algorithm to set the laser wavelength to match the peak wavelength of the spectral filter 104.

For configurations in which the spectral filter includes a peaked spectral profile, the circuitry 110 can lock the selectable wavelength of the tunable laser 102 to the peak of the peaked spectral profile. For configurations in which the spectral filter includes a null, rather than a peak, the circuitry 110 can lock the selectable wavelength of the tunable laser 102 to the null of the peaked spectral profile. As a further alternative, the circuitry 110 can lock the selectable wavelength of the tunable laser 102 to another location on the peaked spectral profile. For example, the circuitry 110 can lock the selectable wavelength of the tunable laser 102 to a wavelength at a 50% location on the peaked spectral profile, to another suitable fractional value on the peaked spectral profile, to an inflection point on the peaked spectral profile, or to another specified value.

In the configuration of FIG. 1, and the configurations of FIGS. 2-6 that follow, an output to the laser is shown as being directed through the spectral filter. In practice, it can be preferable to extract a laser output before the spectral filter, rather than after the spectral filter, to avoid distorting a signal from the laser. In the configuration of FIG. 1, such a pre-filtered laser output can be produced by inserting a power tap between the laser 102 and the spectral filter 104, and optionally converting tap 106 to a 100% reflector. It will be understood that one can modify any of the configurations of FIGS. 2-6 in a similar manner, to extract a laser output before the spectral filter.

FIGS. 2-6 show examples of specific configurations of optical systems that can lock a wavelength of a tunable laser. Each of the configurations of FIGS. 2-6 tunes the laser wavelength in the same manner as in FIG. 1, namely spectrally filtering the laser output with a temperature-insensitive spectral filter, detecting at least a fraction of the spectrally filtered light, and tuning the laser to enhance (optimally maximize) a signal from a detector. Alternatively, the laser can be tuned to reduce (optimally minimize) the signal from the detector, or set the signal to a specified level, as explained above.

In particular, in each of FIGS. 2-6, some or all of the optical elements can be formed at the wafer level in a photon integrated circuit. Forming some or all of the optical elements in this manner can reduce costs when producing the optical systems in volume, can improve device-to-device uniformity, and can simplify alignment of elements to one another.

Figure 2:
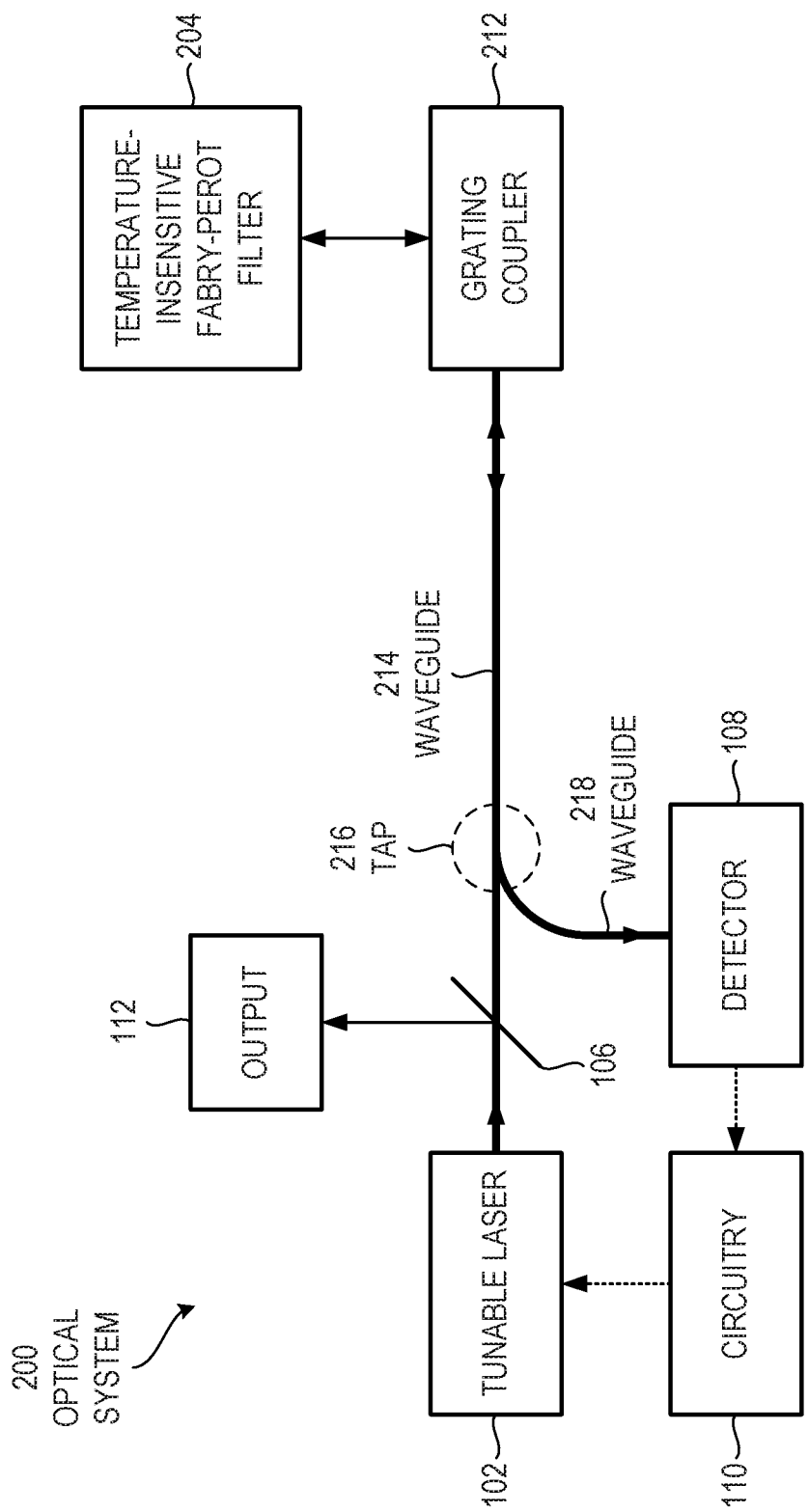
FIG. 2 is a block diagram showing an example of an optical system, in which the spectral filter can be formed integrally with a photonic integrated circuit, and a power tap can direct a fraction of spectrally filtered light to a detector, in accordance with some embodiments.

FIG. 2 is a block diagram showing an example of an optical system 200, in which the spectral filter can be formed integrally with a photonic integrated circuit, and a power tap can direct a fraction of spectrally filtered light to a detector, in accordance with some embodiments.

The tunable laser 102 can produce laser light at a selectable wavelength. In this example, the tunable laser can be formed as part of a layered structure in a photonic integrated circuit.

A first waveguide 214 can direct the laser light from the tunable laser 102 to a grating coupler 212. Whereas the first waveguide 214 can guide the laser light along a path oriented parallel to a plane of the photonic integrated circuit, the grating coupler 212 can redirect the laser light out of the plane of the photonic integrated circuit.

The spectral filter in the optical system 200 is a Fabry-Perot filter 204. In some examples, the Fabry-Perot filter 204 can be formed as a layered structure formed integral with or attached to the photonic integrated circuit. The Fabry-Perot filter 204 of FIG. 2 can be configured to operate in reflection at normal incidence. In the example of FIG. 2, the Fabry-Perot filter 204 can receive the laser light propagating in a first direction, and direct the filtered laser light to the grating coupler 212 along a second direction, opposite the first direction.

Figure 3:
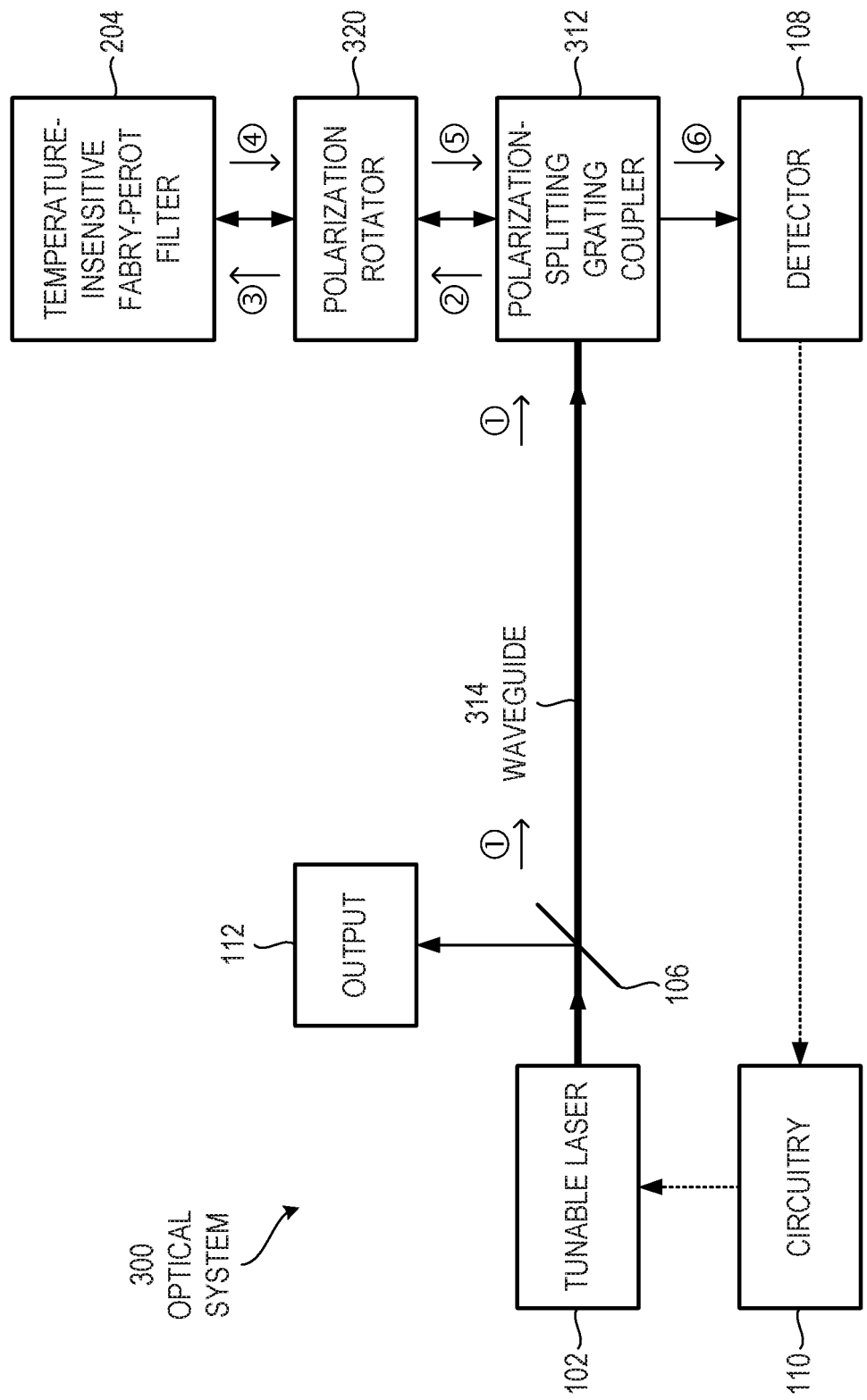
FIG. 3 is a block diagram showing an example of an optical system, in which the spectral filter can be formed integrally with a photonic integrated circuit, and a polarization-sensitive grating coupler can direct the spectrally filtered light to the detector, in accordance with some embodiments.

The grating coupler 212 can further direct at least a fraction of the filtered laser light from the Fabry-Perot filter 204 to the first waveguide 214. A power tap 216 can couple to the first waveguide 214 and can direct at least a fraction of the filtered laser light along a second waveguide 218 to the detector 108. In some examples, the functions of the powers taps 106 and 216 can be combined into a single element. As an improvement over the configuration of FIG. 2, an optical system can use a polarization-sensitive element to separate incident light from return light. FIG. 3 shows an example of an optical system that uses such a polarization-sensitive element.

FIG. 3 is a block diagram showing an example of an optical system 300, in which the spectral filter can be formed integrally with a photonic integrated circuit, and a polarization-sensitive grating coupler can direct the spectrally filtered light to the detector, in accordance with some embodiments.

The tunable laser 102 can produce laser light at a selectable wavelength. In this example, the tunable laser can be formed as part of a layered structure in a photonic integrated circuit.

A waveguide 314 can direct the laser light from the tunable laser 102 to a grating coupler 312. Whereas the waveguide 314 can guide the laser light along a path oriented parallel to a plane of the photonic integrated circuit, the grating coupler 312 can redirect the laser light out of the plane of the photonic integrated circuit. In addition, the grating coupler 312 can be polarization-sensitive, as explained below, with different coupling efficiencies for TE and TM polarization states.

A polarization rotator 320 can be positioned in an optical path between the grating coupler 312 and the Fabry-Perot filter 204. The polarization rotator 320 can be configured such that a polarization state of laser light entering a first side of the polarization rotator 320 is orthogonal to a polarization state of filtered laser light exiting the first side of the polarization rotator 320 after the light passes twice through the polarization rotator 320 in opposite directions. In some examples, the polarization rotator 320 can be a Faraday rotator, which can rotate a plane of polarization by forty-five degrees in a single pass. When used in double-pass, as shown in FIG. 3, a Faraday rotator can adjust the polarization of exiting light to be orthogonal to the polarization of incident light. In other examples, the polarization rotator 320 can be a quarter-wave plate having a fast axis oriented at forty-five degrees with respect to an incident polarization In some examples, the grating coupler 312 can be a polarization-splitting grating coupler that can receive the laser light with a first polarization state from the waveguide 314; direct the laser light to the Fabry-Perot filter 204; receive the filtered laser light with a second polarization state, orthogonal to the first polarization state, from the Fabry-Perot filter 204; and direct the filtered laser light to the detector 108. In some examples, the detector 108 can be positioned beneath the polarization-splitting grating coupler 312, so that the polarization-splitting grating coupler 312 is positioned between the Fabry-Perot filter 204 and the detector 108.

In some examples, the polarization rotator 320 and Fabry-Perot filter 204 can be disposed directly on a photonic integrated circuit. In other examples, the polarization rotator 320 and Fabry-Perot filter 204 can be disposed on a substrate on an opposite side of the photonic integrated circuit, so that light from the grating coupler propagates through the substrate before reaching the Fabry-Perot filter 204. In some examples, light propagates through a dielectric material in the photonic integrated circuit between the grating coupler 312 and the polarization rotator 320.

It is instructive to trace a light path through the optical system 300. The tunable laser 102 can produce a first light at a selectable wavelength. In FIG. 3, the first light is denoted by a circled numeral one; second, third and additional lights are also denoted by respective circled numerals. The waveguide 314 can direct the first light from the tunable laser 102. The polarization-splitting grating coupler 312 can redirect the first light from the waveguide 314 to form a second light. The polarization rotator 320 can adjust a polarization of the second light to form a third light. The temperature-insensitive Fabry-Perot filter 204 can spectrally filter the third light to form a fourth light. The Fabry-Perot filter 204 can have a temperature-insensitive peak wavelength and increasing attenuation at wavelengths away from the peak wavelength. The polarization rotator 320 can further adjust a polarization of the fourth light to form a fifth light. The fifth light can be polarized orthogonal to the second light. The polarization-splitting grating coupler 312 can further receive the fifth light and direct a sixth light to the detector 108. Circuitry 110 coupled to the detector 108 and the tunable laser 102 can tune the tunable laser 102 to enhance (optimally maximize) a signal from the detector 108 and thereby adjust the selectable wavelength of the tunable laser 102 to match the peak wavelength of the Fabry-Perot filter 204. As explained above, the circuitry 110 can alternatively tune the tunable laser 102 to set a signal from the detector 108 to a specified level other than a peak.

Figure 4:
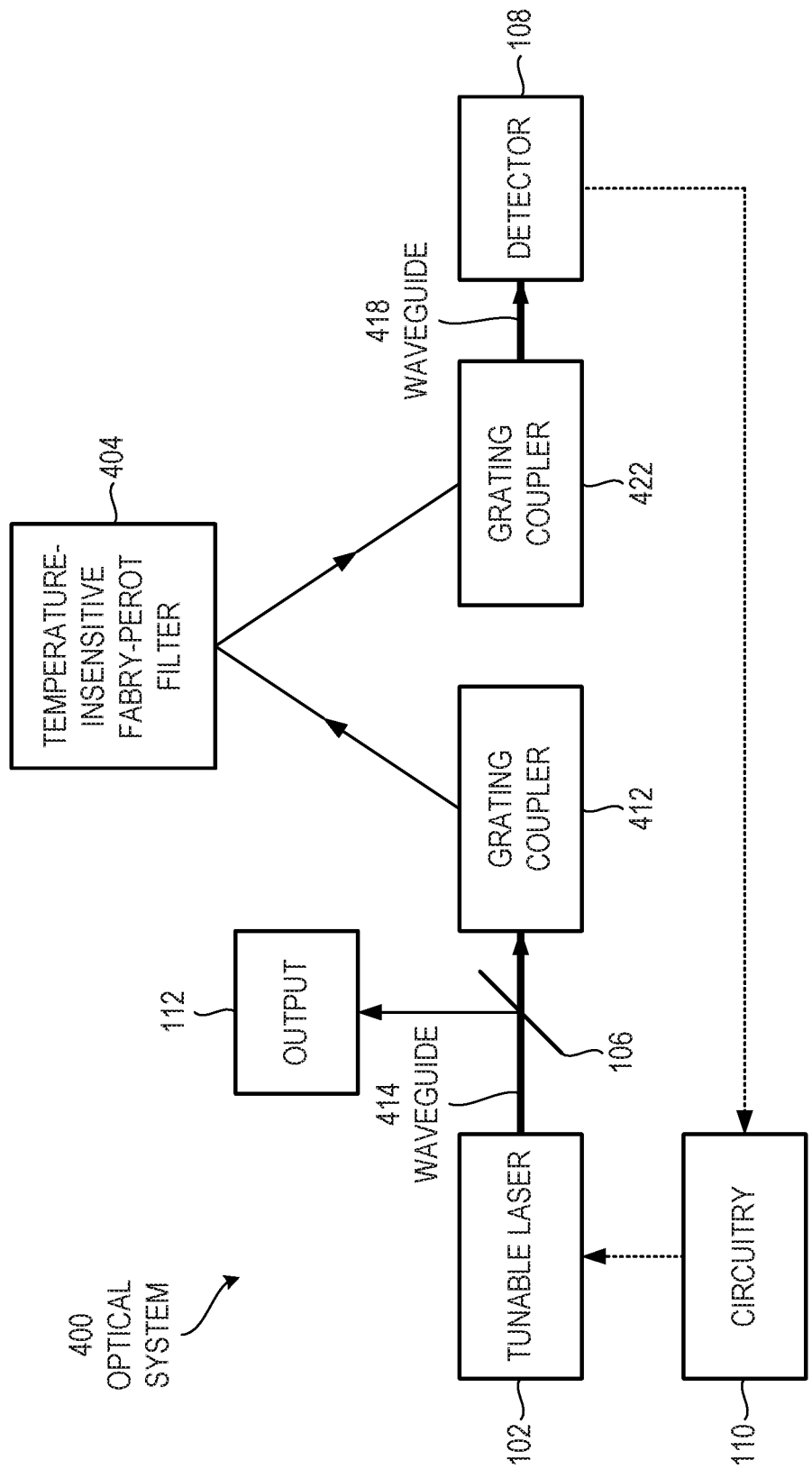
FIG. 4 is a block diagram showing an example of an optical system, in which the spectral filter can be formed integrally with a photonic integrated circuit and configured to operate at non-normal incidence, and two grating couplers can direct light to and from the spectral filter, in accordance with some embodiments.

FIG. 4 is a block diagram showing an example of an optical system 400, in which the spectral filter can be formed integrally with a photonic integrated circuit and configured to operate at non-normal incidence, and two grating couplers can direct light to and from the spectral filter, in accordance with some embodiments.

A tunable laser 102 can produce laser light at a selectable wavelength. A first waveguide 214 can direct the laser light from the tunable laser 102 to a first grating coupler 412. The grating coupler 412 can direct at least a fraction of the laser light to the spectral filter. In the example of FIG. 4, the spectral filter is a Fabry-Perot filter 404 operating in non-normal incidence. The Fabry-Perot filter 404 can receive the laser light propagating in a first direction, spectrally filter the laser light to form filtered laser light, and direct the filtered laser light away from the Fabry-Perot filter 404 in a second direction, angled with respect to the first direction. The Fabry-Perot filter 404 can have a temperature-insensitive peak wavelength and increasing attenuation at wavelengths away from the peak wavelength. A second grating coupler 422 can be positioned to receive the filtered laser light from the Fabry-Perot filter 404 and direct at least a portion of the filtered laser light to the detector 108.

In the configuration of FIG. 4, using the Fabry-Perot filter 404 at non-normal incidence can separate the incident and return light, so that two grating couplers can couple light onto and from the Fabry-Perot filter 404. The optical system of FIG. 4 does not use any polarization-sensitive elements to separate incident light from return light. An advantage of the configuration of FIG. 4 is that the optical elements are arranged in a geometry that can eliminate back-reflections. Another advantage is that the optical elements are arranged in a geometry that can isolate the tunable laser 102 from return light.

The configurations of FIGS. 2-4 can form the spectral filter integrally with the photonic integrated circuit. Such configurations can be compact and convenient, and can be relatively inexpensive if the spectral filter is manufactured at the wafer level. However, one potential issue with such integral configurations is that they can also be relatively difficult to modify, for design changes. For example, modifying an integrally-formed spectral filter can involve changing a manufacturing process for the photonic integrated circuit, which can be expensive and/or difficult.

Figure 5:
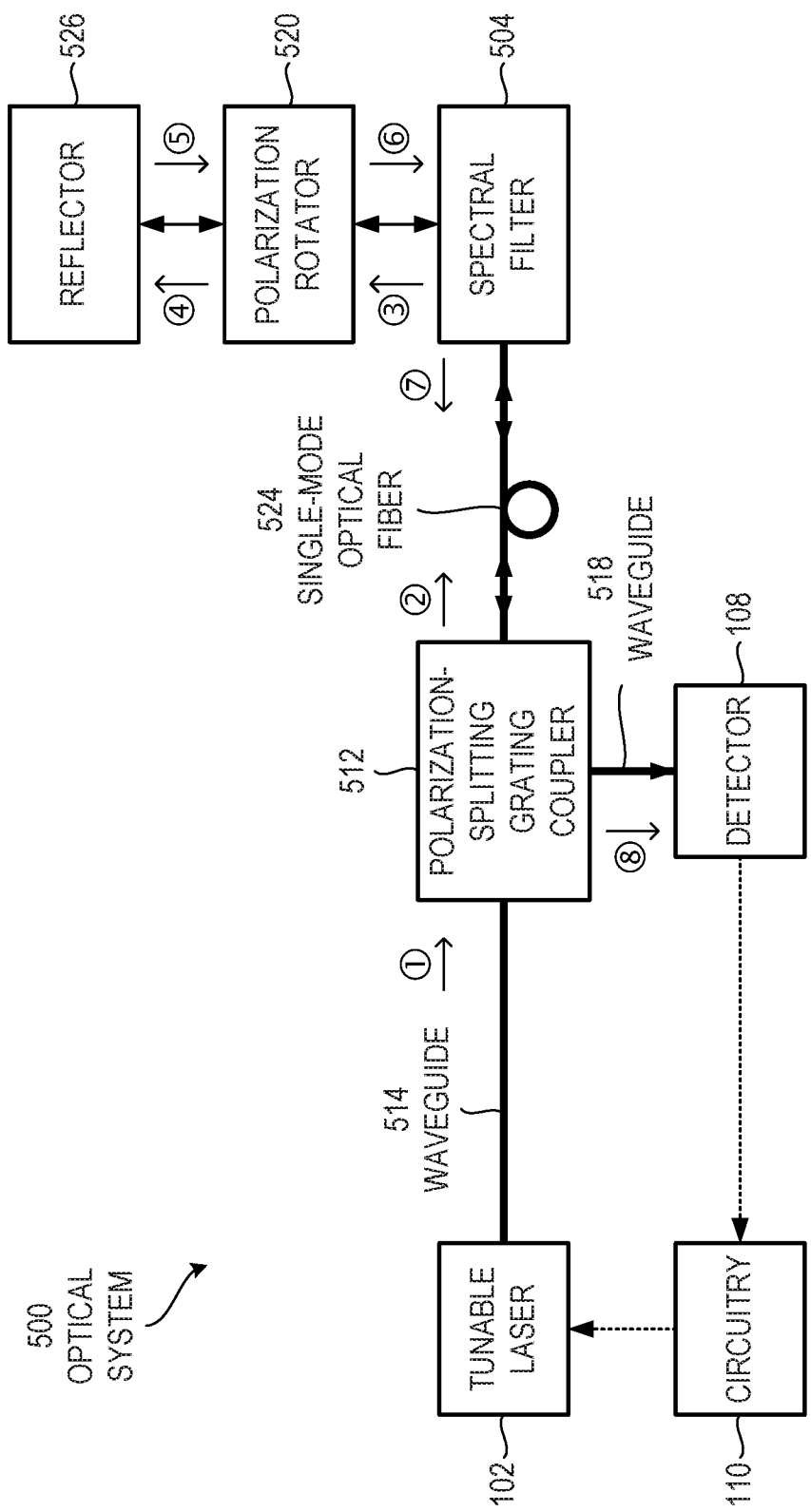
FIG. 5 is a block diagram showing an example of an optical system, in which the spectral filter can be formed separately from a photonic integrated circuit and attached to the photonic integrated circuit by an optical fiber, in accordance with some embodiments.
Figure 6:
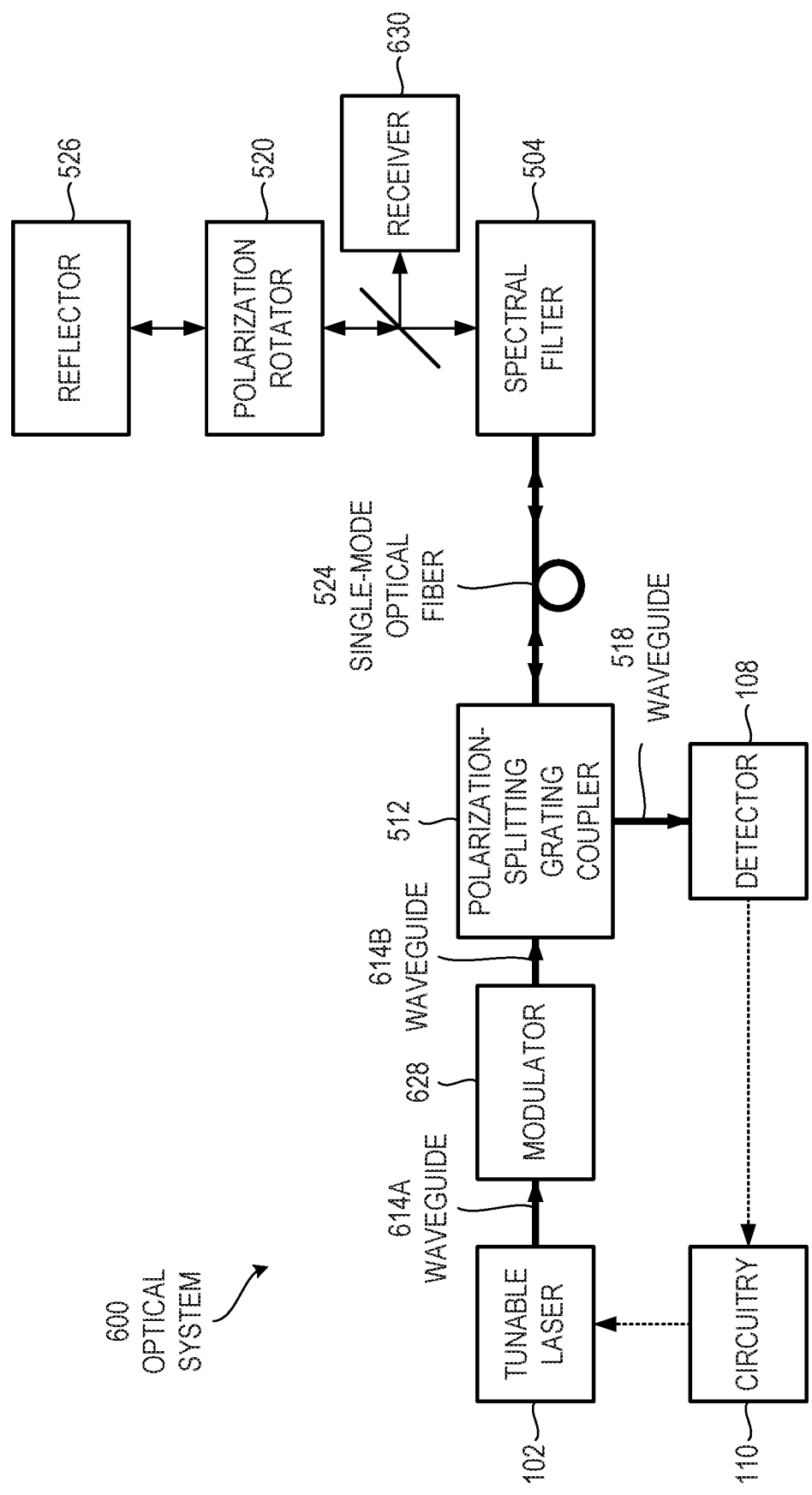
FIG. 6 is a block diagram showing an example of an optical system, in which the spectral filter can be formed separately from a photonic integrated circuit and attached to the photonic integrated circuit by an optical fiber, and light is modulated and received on opposite sides of the optical fiber, in accordance with some embodiments.

As an alternative to forming the spectral filter integrally with the photonic integrated circuit, the spectral filter can be formed separate from the photonic integrated circuit, and attached to the photonic integrated circuit by an optical fiber. Such configurations can add flexibility to the optical system. For example, modifying the spectral filter for such a configuration can be done without changing a manufacturing process for the photonic integrated circuit, which can be beneficial. FIGS. 5 and 6 show examples of configurations in which the spectral filter is formed separate from the photonic integrated circuit, and attached to the photonic integrated circuit by an optical fiber.

FIG. 5 is a block diagram showing an example of an optical system 500, in which the spectral filter can be formed separately from a photonic integrated circuit and attached to the photonic integrated circuit by an optical fiber, in accordance with some embodiments.

A tunable laser 102 can produce laser light at a selectable wavelength. A first waveguide 514 can direct the laser light from the tunable laser 102 to a polarization-splitting grating coupler 512. The polarization-splitting grating coupler 512 can direct at least a fraction of the laser light to a single-mode optical fiber 524. The single-mode optical fiber 524 can direct the laser light from the polarization-splitting grating coupler 512 to a spectral filter 504. The spectral filter 504 can have a temperature-insensitive peak wavelength and increasing attenuation at wavelengths away from the peak wavelength. The spectral filter 504 can spectrally filter the laser light to form filtered laser light. In some examples, the spectral filter 504 can be a Fabry-Perot filter. In other examples, the spectral filter 504 can be a thin-film filter. In some examples, the spectral filter 504 can be a multiplexer, such as an arrayed waveguide grating or an interleaver.

The optical system 500 can further include a polarization rotator 520 and a reflector 526, which can receive filtered laser light from the spectral filter 504 with a first polarization, and reflect the filtered laser light back to the spectral filter 504 with a second polarization state, orthogonal to the first polarization state. In some examples, the polarization rotator 520 can be a Faraday rotator, which can rotate a plane of polarization by forty-five degrees in a single pass. In other examples, the polarization rotator 520 can be a quarter-wave plate having a fast axis oriented at forty-five degrees with respect to an incident polarization. In some examples, the reflector 526 is a 100% reflector. In other examples, the reflector 526 can reflect only a fraction of incident light, and can optionally direct a remaining fraction of incident light to a detector.

In the configuration of FIG. 5, the filtered laser light passes through the spectral filter twice, which can increase a steepness of the wavelength filter edges on both sides of the peak wavelength, and can therefore increase a peakedness of the spectral profile of the spectral filter 504.

The single-mode optical fiber 524 can further direct the filtered laser light from the spectral filter 504 to the polarization-splitting grating coupler 512. The polarization-splitting grating coupler 512 can: receive the laser light with a first polarization state from the first waveguide 514; direct the laser light to the single-mode optical fiber 524; receive the filtered laser light with a second polarization state, orthogonal to the first polarization state, from the single-mode optical fiber 524; and direct the filtered laser light to the detector 108. A second waveguide 518 can direct the filtered laser light from the polarization-splitting grating coupler 512 to the detector 108.

The detector 108 can detect at least a fraction of the filtered laser light. Circuitry 110 coupled to the detector 108 and the tunable laser 102 can tune the tunable laser to enhance (optimally maximize) a signal from the detector 108 and adjust the selectable wavelength of the tunable laser 102 to match the peak wavelength of the spectral filter 504. As explained above, the circuitry 110 can alternatively tune the tunable laser 102 to set a signal from the detector 108 to a specified level other than a peak.

Note that the polarization rotator 520 in FIG. 5 can compensate for birefringence in the single-mode optical fiber 524, by ensuring that light traveling in one direction in the fiber with a first polarization state travels the opposite direction in the fiber with a polarization state orthogonal to the first polarization state. In some examples, the birefringence in the single-mode optical fiber 524 changes relatively slowly, over the length of time it takes for light to propagate from one end of the single-mode optical fiber 524 to the opposite end.

In a specific example, the optical system 500 can include a tunable laser 102 configured to produce a first light at a selectable wavelength; a waveguide 514 configured to direct the first light from the tunable laser; a polarization-splitting grating coupler 512 configured to direct the first light from the waveguide 514 to form a second light; a single-mode optical fiber 524 configured to direct the second light from the polarization-splitting grating coupler 512; a spectral filter 504 configured to spectrally filter the second light from the single-mode optical fiber 524 to form a third light, the spectral filter having a temperature-insensitive peak wavelength and increasing attenuation at wavelengths away from the peak wavelength; a polarization rotator 520 configured to adjust a polarization of the third light from the spectral filter 504 to form a fourth light; a reflector 526 configured to reflect the fourth light from the polarization rotator 520 to form a fifth light; the polarization rotator 520 further configured to adjust a polarization of the fifth light from the reflector 526 to form a sixth light, the sixth light being polarized orthogonal to the third light, the spectral filter 504 further configured to spectrally filter the sixth light from the polarization rotator 520 to form an seventh light, the single-mode optical fiber 524 further configured to direct the seventh light from the spectral filter 504; the polarization-splitting grating coupler 512 further configured to direct the seventh light from the single-mode optical fiber 524 to form an eighth light; a detector 108 configured to receive the eighth light; and circuitry 110 coupled to the detector and the tunable laser, the circuitry being configured to tune the tunable laser to enhance (optimally maximize) a signal from the detector and thereby adjust the selectable wavelength of the tunable laser to match the peak wavelength of the spectral filter.

FIG. 6 is a block diagram showing an example of an optical system 600, in which the spectral filter can be formed separately from a photonic integrated circuit and attached to the photonic integrated circuit by an optical fiber, and light is modulated and received on opposite sides of the optical fiber, in accordance with some embodiments.

Compared with the optical system 500 of FIG. 5, a modulator 628 and waveguide segments 614A-B replace waveguide 514, and a receiver (e.g., a demodulator, or a port for directing the modulated light to a downstream receiver) 630 receives a fraction of light after the spectral filter 504. The modulator 628 can modulate data onto the laser light. The receiver 630 can demodulate the data from the filtered laser light. In some examples, both the modulator 628 and receiver 630 are present in the optical system 600. In other examples, one or both of the modulator 628 or receiver 630 can be omitted.

There are numerous options for manufacturing the various optical systems shown in the figures and described above. In some examples, the polarization rotator and/or reflective surface can be incorporated into a stack of materials disposed on a wafer surface. For example, the spectral filter can be bonded to a surface above the grating coupler, and the detector can be bonded above the spectral filter. As another example, the spectral filter and detector can be bonded to each other, then bonded above the grating coupler. As another example, the Fabry-Perot filter can be grown or deposited in one or more dielectric layer above the grating coupler, and the detector can be bonded above the Fabry-Perot filter. As another example, the grating coupler can function as the spectral filter, and the detector can be bonded above the grating coupler. Other suitable manufacturing options can also be used.

Figure 7:
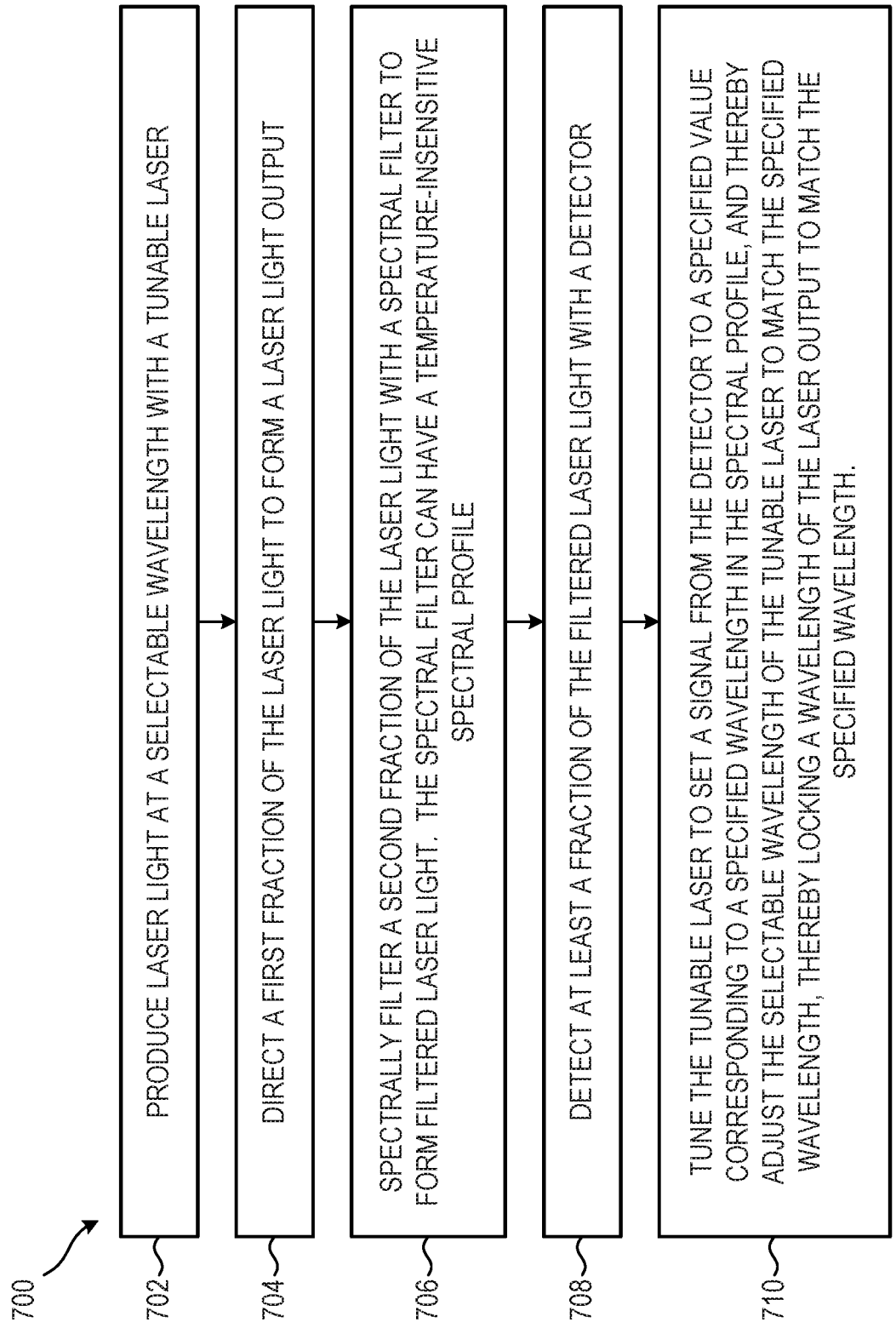
FIG. 7 is a flow chart showing an example of a method for locking a wavelength of a tunable laser, in accordance with some embodiments.

FIG. 7 is a flow chart showing an example of a method 700 for locking a wavelength of a tunable laser, in accordance with some embodiments. The method 700 can be executed by any suitable optical system with a tunable filter, such as 100, 200, 300, 400, 500, 600, or another suitable optical system. The method 700 is but one example of a method 700 for locking a wavelength of a tunable laser; other suitable methods can also be used.

At operation 702, the optical system can produce laser light at a selectable wavelength with a tunable laser.

At operation 704, the optical system can direct a first fraction of the laser light to form a laser light output.

At operation 706, the optical system can spectrally filter a second fraction of the laser light with a spectral filter to form filtered laser light. The spectral filter can have a temperature-insensitive spectral profile. In some examples, the spectral profile can include a temperature-insensitive peak wavelength and increasing attenuation at wavelengths away from the peak wavelength. In other examples, the spectral profile can include a temperature-insensitive null wavelength and decreasing attenuation at wavelengths away from the null wavelength.

At operation 708, the optical system can detect at least a fraction of the filtered laser light with a detector.

At operation 710, the optical system can tune the tunable laser to set a signal from the detector to a specified value corresponding to a specified wavelength in the spectral profile, and thereby adjust the selectable wavelength of the tunable laser to match the specified wavelength, thereby locking a wavelength of the laser light output to match the specified wavelength. In some examples, in which the spectral profile includes a peak wavelength, the optical system can tune the tunable laser to enhance (optimally maximize) a signal from the detector, thereby adjusting the selectable wavelength of the tunable laser to match the peak wavelength of the spectral filter, thereby locking a wavelength of the laser light output to match the peak wavelength of the spectral filter. In alternate configurations, in which the spectral profile includes a null wavelength, the optical system can tune the tunable laser to reduce (optimally minimize) a signal from the detector, thereby adjusting the selectable wavelength of the tunable laser to match the null wavelength of the spectral filter, thereby locking a wavelength of the laser light output to match the null wavelength of the spectral filter.

The preceding description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the disclosure. Thus, phrases such as "in one embodiment" or "in an alternate embodiment" appearing herein describe various embodiments and implementations of the disclosure, and do not necessarily all refer to the same embodiment. However, they are also not necessarily mutually exclusive.

Throughout this specification, several terms of art are used. These terms are to take on their ordinary meaning in the art from which they come, unless specifically defined herein or the context of their use would clearly suggest otherwise. In the preceding description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout the foregoing specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

The above described embodiments of the disclosure may include discrete devices, or may be components of a photonic integrated circuit (PIC). PICs that consist of multiple photonic components offer many advantages over those that consist of discrete photonic devices, such as higher efficiency due to the removal of coupling losses between components, fewer packages and packaging steps, smaller size, and overall better performance.

The above-described embodiments of the disclosure may include SOI or silicon based (e.g., silicon nitride (SiN)) devices, or may include devices formed from both silicon and a non-silicon material. Said non-silicon material (alternatively referred to as "heterogeneous material") may include one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V based materials may be significantly higher than in silicon based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in the heterogeneous optical devices described below. In embodiments of the disclosure, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may utilize the Faraday Effect, in which the magnetic field associated with an electrical signal modulates an optical beam, offering high bandwidth modulation, and rotates the electric field of the optical mode enabling optical isolators. Said magneto-optic materials may include, for example, materials such as such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials may include, for example, lithium niobate ($LiNbO_3$) or lithium tantalate ($LiTaO_3$).

In the foregoing detailed description, the method and apparatus of the present disclosure have been described with reference to specific exemplary embodiments thereof. It will, however, be evident that various modifications and changes may be made thereto without departing from the broader spirit and scope of the present disclosure. The present specification and figures are accordingly to be regarded as illustrative rather than restrictive.

What is claimed is:

1. An optical system, comprising:
   a tunable laser configured to produce laser light at a selectable wavelength, wherein a first fraction of the laser light forms a laser light output;
   a spectral filter configured to spectrally filter a second fraction of the laser light, separate from the first fraction of the laser light, to form filtered laser light, the spectral filter having a temperature-insensitive spectral profile, the spectral profile having a peak wavelength and increasing attenuation at wavelengths away from the peak wavelength;
   a detector configured to detect at least a fraction of the filtered laser light; and
   circuitry coupled to the detector and the tunable laser, the circuitry being configured to:
      adjust either the selectable wavelength, the peak wavelength or both so that the filtered laser light varies with a periodic oscillation;
      sense a polarity of the periodic oscillation;
      determine which side of the peak wavelength the selectable wavelength of the tunable laser is on based on the polarity; and
      adjust the selectable wavelength of the tunable laser to match the peak wavelength based on the determination, and thereby lock a wavelength of the laser light output to match the peak wavelength.

2. The optical system of claim 1, further comprising:
   a first grating coupler configured to direct at least a fraction of the laser light to the spectral filter; and
   a first waveguide configured to direct the laser light from the tunable laser to the first grating coupler.

3. The optical system of claim 2, wherein the spectral filter is a Fabry-Perot filter configured to receive the laser light propagating in a first direction, and direct the filtered laser light to the first grating coupler along a second direction, opposite the first direction.

4. The optical system of claim 3,
   further comprising a polarization rotator positioned in an optical path between the grating coupler and the Fabry-Perot filter, the polarization rotator being configured such that a polarization state of laser light entering a first side of the polarization rotator is orthogonal to a polarization state of filtered laser light exiting from the first side of the polarization rotator after the laser light passes twice through the polarization rotator in opposite directions;
   wherein the first grating coupler is a polarization-splitting grating coupler configured to:
      receive the laser light with a first polarization state from the first waveguide;
      direct the laser light to the Fabry-Perot filter;
      receive the filtered laser light with a second polarization state, orthogonal to the first polarization state, from the Fabry-Perot filter; and
      direct the filtered laser light to the detector.

5. The optical system of claim 3,
   wherein the first grating coupler is further configured to direct at least a fraction of the filtered laser light to the first waveguide; and
   further comprising a tap coupled to the first waveguide and configured to direct at least a fraction of the filtered laser light to the detector.

6. The optical system of claim 2,
   wherein the spectral filter is a reflective Fabry-Perot filter configured to receive the laser light propagating in a first direction, spectrally filter the laser light to form filtered laser light, and direct the filtered laser light to a second grating coupler away from the Fabry-Perot filter in a second direction, angled with respect to the first direction; and
   further comprising a second grating coupler positioned to receive the filtered laser light from the Fabry-Perot filter and direct at least a portion of the filtered laser light to the detector.

7. The optical system of claim 1, wherein the tunable laser is a diode laser having an electrically-adjustable wavelength.

8. The optical system of claim 1, wherein the spectral filter is a temperature-insensitive Fabry-Perot filter.

9. The optical system of claim 8, wherein the Fabry-Perot filter is formed from first and second reflectors defining a cavity between the first and second reflectors, the cavity having an optical path length that remains constant over a specified range of temperatures.

10. A method for locking a wavelength of a tunable laser, the method comprising:
   producing laser light at a selectable wavelength with a tunable laser;
   directing a first fraction of the laser light to form a laser light output;
   spectrally filtering a second fraction of the laser light, separate from the first fraction of the laser light, with a spectral filter to form filtered laser light, the spectral filter having a temperature-insensitive spectral profile, the spectral profile having a peak wavelength and increasing attenuation at wavelengths away from the peak wavelength;

detecting at least a fraction of the filtered laser light with a detector; and adjusting either the selectable wavelength, the peak wavelength or both so that the filtered laser light varies with a periodic oscillation;

sensing a polarity of the periodic oscillation;

determining which side of the peak wavelength the selectable wavelength of the tunable laser is on based on the polarity; and adjusting the selectable wavelength of the tunable laser to match the peak wavelength based on the determination, thereby locking a wavelength of the laser light output to match the peak wavelength.

11. The method of claim 10, further comprising:
rotating a polarization state of the filtered laser light; and
separating the filtered laser light from the laser light with a polarization-splitting grating coupler.

12. The method of claim 10, wherein spectrally filtering the second fraction of the laser light comprises:
propagating the laser light through a temperature-insensitive optical path length in a first direction through a Fabry-Perot cavity, the temperature-insensitive optical path length defining the peak wavelength;
reflecting the laser light from a longitudinal end of the Fabry-Perot cavity to form the filtered laser light; and
propagating the filtered laser light through the temperature-insensitive optical path length in a second direction, opposite the first direction, through the Fabry-Perot cavity.

13. The method of claim 10, wherein the tunable laser is a diode laser having an electrically-adjustable wavelength.

14. The method of claim 10, wherein the spectral filter is a temperature-insensitive Fabry-Perot filter.

15. The method of claim 14, wherein the Fabry-Perot filter is formed from first and second reflectors defining a cavity between the first and second reflectors, the cavity having an optical path length that remains constant over a specified range of temperatures.

16. An optical system, comprising:
a tunable laser configured to produce laser light at a selectable wavelength, wherein a first fraction of the laser light forms a laser light output;
a spectral filter configured to spectrally filter a second fraction of the laser light, separate from the first fraction of the laser light, to form filtered laser light, the spectral filter having a temperature-insensitive spectral profile, the spectral profile having a null wavelength and decreasing attenuation at wavelengths away from the null wavelength;
a detector configured to detect at least a fraction of the filtered laser light; and
circuitry coupled to the detector and the tunable laser, the circuitry being configured to:

adjust either the selectable wavelength, the null wavelength or both so that the filtered laser light varies with a periodic oscillation;
sense a polarity of the periodic oscillation;
determine which side of the null wavelength the selectable wavelength of the tunable laser is on based on the polarity; and
adjust the selectable wavelength of the tunable laser to match the null wavelength based on the determination, and thereby lock a wavelength of the laser light output to match the null wavelength.

17. The optical system of claim 16, wherein the tunable laser is a diode laser having an electrically-adjustable wavelength.

18. The optical system of claim 16, wherein the spectral filter is a temperature-insensitive Fabry-Perot filter.

19. The optical system of claim 18, wherein the Fabry-Perot filter is formed from first and second reflectors defining a cavity between the first and second reflectors, the cavity having an optical path length that remains constant over a specified range of temperatures.

20. A method for locking a wavelength of a tunable laser, the method comprising:
producing laser light at a selectable wavelength with a tunable laser;
directing a first fraction of the laser light to form a laser light output;
spectrally filtering a second fraction of the laser light, separate from the first fraction of the laser light, with a spectral filter to form filtered laser light, the spectral filter having a temperature-insensitive spectral profile, the spectral profile having a null wavelength and decreasing attenuation at wavelengths away from the null wavelength;
detecting at least a fraction of the filtered laser light with a detector; and
adjusting either the selectable wavelength, the null wavelength or both so that the filtered laser light varies with a periodic oscillation;
sensing a polarity of the periodic oscillation;
determining which side of the null wavelength the selectable wavelength of the tunable laser is on based on the polarity; and
adjusting the selectable wavelength of the tunable laser to match the null wavelength based on the determination, thereby locking a wavelength of the laser light output to match the null wavelength.

21. The method of claim 20, wherein the tunable laser is a diode laser having an electrically-adjustable wavelength.

22. The method of claim 20, wherein the spectral filter is a temperature-insensitive Fabry-Perot filter.

23. The method of claim 22, wherein the Fabry-Perot filter is formed from first and second reflectors defining a cavity between the first and second reflectors, the cavity having an optical path length that remains constant over a specified range of temperatures.

* * * * *